United States Patent
Chung et al.

(10) Patent No.: US 10,020,352 B2
(45) Date of Patent: Jul. 10, 2018

(54) SUBSTRATE STRUCTURE

(71) Applicant: Samsung Display Co., Ltd., Yongin-si, Gyeonggi-Do (KR)

(72) Inventors: Yung-Bin Chung, Seoul (KR); Bo-Geon Jeon, Hwaseong-si (KR); Eun-Jeong Cho, Busan (KR); Hye-Hyang Park, Yongin-si (KR); Sung-Hoon Yang, Seoul (KR); Woo-Seok Jeon, Seoul (KR); Joo-Hee Jeon, Anyang-si (KR); Chaun-Gi Choi, Suwon-si (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 15/210,563

(22) Filed: Jul. 14, 2016

(65) Prior Publication Data

US 2017/0104048 A1  Apr. 13, 2017

(30) Foreign Application Priority Data

Oct. 13, 2015  (KR) .................. 10-2015-0143067

(51) Int. Cl.
*H01L 27/14* (2006.01)
*H01L 27/32* (2006.01)
*H01L 51/52* (2006.01)

(52) U.S. Cl.
CPC ...... *H01L 27/3258* (2013.01); *H01L 27/3262* (2013.01); *H01L 51/5253* (2013.01); *H01L 27/326* (2013.01)

(58) Field of Classification Search
CPC ............. H01L 51/5253; H01L 27/3258; H01L 27/3262; H01L 27/326
See application file for complete search history.

(56) References Cited

U.S. PATENT DOCUMENTS

2008/0309581 A1* 12/2008 Fujii .................... H01Q 1/2225
343/873

FOREIGN PATENT DOCUMENTS

| KR | 10-2006-0001748 A | 1/2006 |
| KR | 10-2013-0033941 A | 4/2013 |
| KR | 10-2014-0040606 A | 4/2014 |
| KR | 10-2015-0028128 A | 3/2015 |

* cited by examiner

*Primary Examiner* — Elias M Ullah
(74) *Attorney, Agent, or Firm* — Innovation Counsel LLP

(57) ABSTRACT

A substrate structure may be used in a display device. The substrate structure may include a base substrate, a transistor, and a silicon oxynitride layer. The transistor may include a semiconductor member and a gate electrode and may overlap the base substrate. The silicon oxynitride layer may directly contact at least one of the base substrate, the semiconductor member, and the gate electrode and may include (and/or contain) a hydrogen atom set. A hydrogen concentration in the silicon oxynitride layer may be greater than or equal to 1.52 atomic percent.

20 Claims, 9 Drawing Sheets

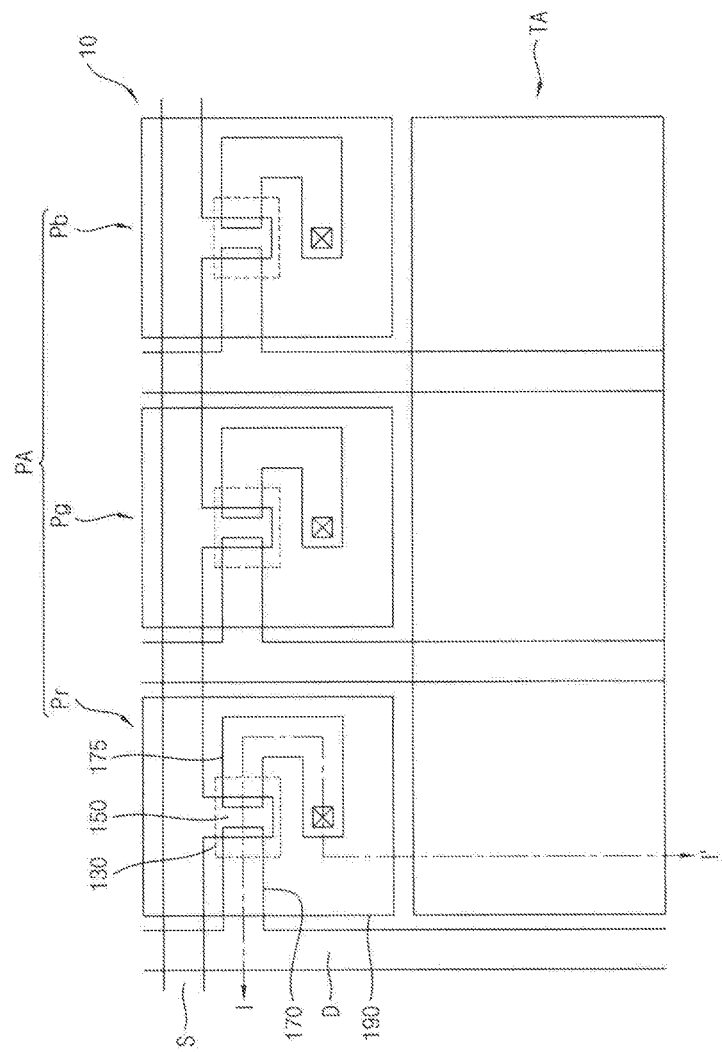

SUBSTRATE STRUCTURE

CROSS-REFERENCE TO RELATED APPLICATION(S)

This application claims priority under 35 USC § 119 to Korean Patent Application No. 10-2015-0143067, filed on Oct. 13, 2015 in the Korean Intellectual Property Office (KIPO); the entire disclosure of the Korean Patent Application is incorporated by reference herein.

BACKGROUND

1. Field

Example embodiments relate to substrate structures and display devices.

2. Description of the Related Art

A display device, e.g., an organic light-emitting display (OLED) device may include a stack of insulation layers that contain different materials. The insulation layers may cause optical characteristics (e.g., transmittance) of the OLED device to be unsatisfactory.

An active member of a thin film transistor (TFT) included in the display device may be influenced by insulation layers disposed on and/or under the active member. As a result, electron mobility of the TFT may insufficient, and thus performance of the TFT may be unsatisfactory.

SUMMARY

Example embodiments may be related to a transparent display substrate that includes a silicon oxynitride insulation layer containing hydrogen.

Example embodiments may be related to a transparent display substrate that includes an insulation layer having a predetermined hydrogen concentration.

Example embodiments provides a transparent display device that includes an insulation layer containing hydrogen atoms that form one-to-one silicon-hydrogen bonds.

According to example embodiments, a transparent display substrate may include a base substrate having a pixel area and a transmission area, a pixel circuit disposed on the base substrate in the pixel area and including an active member, a gate electrode, a source electrode and a drain electrode, a gate insulation layer disposed on the base substrate to cover the active member, an insulation interlayer disposed on the gate insulation layer to cover the gate electrode, and a pixel electrode disposed over the base substrate in the pixel area and electrically connected to the pixel circuit. The insulation interlayer may include silicon oxynitride containing hydrogen for forming silicon-hydrogen (Si—H) bonds. The insulation interlayer may have a hydrogen concentration in a range of about 1.52 atomic percent to about 5.04 atomic percent.

In example embodiments, the base substrate may include polyimide-based resin.

In example embodiments, the gate insulation layer may include silicon oxynitride.

In some example embodiments, the transparent display substrate may additionally include a barrier layer disposed between the base substrate and the active member.

In some example embodiments, the barrier layer may include silicon oxynitride.

In some example embodiments, the barrier layer may include hydrogen for forming silicon-hydrogen (Si—H) bonds, and may have a hydrogen concentration in a range of about 1.52 atomic percent to about 5.04 atomic percent.

In some example embodiments, the transparent display substrate may additionally include a buffer layer disposed between the barrier layer and the active member.

In some example embodiments, the buffer layer may include silicon oxynitride.

In some example embodiments, the buffer layer may include hydrogen for forming silicon-hydrogen bonds, and may have a hydrogen concentration in a range of about 1.52 atomic percent to about 5.04 atomic percent.

According to example embodiments, a transparent display substrate may include a base substrate having a pixel area and a transmission area, a pixel circuit disposed on the base substrate in the pixel area and including an active member, a gate electrode, a source electrode and a drain electrode, a gate insulation layer disposed on the base substrate to cover the active member, an insulation interlayer disposed on the gate insulation layer to cover the gate electrode, and a pixel electrode disposed over the base substrate in the pixel area and electrically connected to the pixel circuit. The insulation interlayer may include silicon oxynitride containing hydrogen. The insulation interlayer may have a hydrogen concentration in a range of about 9.34 atomic percent to about 22.65 atomic percent.

In example embodiments, the base substrate may include polyimide-based resin.

In example embodiments, the gate insulation layer may include silicon oxynitride.

In some example embodiments, the transparent display substrate may additionally include a barrier layer disposed between the base substrate and the active member.

In some example embodiments, the barrier layer may include silicon oxynitride.

In some example embodiments, the barrier layer may include hydrogen, and may have a hydrogen concentration in a range of about 9.34 atomic percent to about 22.65 atomic percent.

In some example embodiments, the transparent display substrate may additionally include a buffer layer disposed between the barrier layer and the active member.

In some example embodiments, the buffer layer may include silicon oxynitride.

In some example embodiments, the buffer layer may include hydrogen, and may have a hydrogen concentration in a range of about 9.34 atomic percent to about 22.65 atomic percent.

According to example embodiments, a transparent display device may include a base substrate having a pixel area and a transmission area, a pixel circuit disposed on the base substrate in the pixel area and including an active member, a gate electrode, a source electrode and a drain electrode, a gate insulation layer disposed on the base substrate to cover the active member, an insulation interlayer disposed on the gate insulation layer to cover the gate electrode, a pixel electrode disposed over the base substrate in the pixel area and electrically connected to the pixel circuit, a display layer disposed on the pixel circuit, an opposing electrode disposed on the display layer, and a transmitting window provided over the base substrate in the transmission area. The insulation interlayer may include silicon oxynitride containing hydrogen for forming silicon-hydrogen bonds. The insulation interlayer may have a hydrogen concentration in a range of about 1.52 atomic percent to about 5.04 atomic percent.

In example embodiments, the base substrate may include polyimide-based resin.

Example embodiments may be related to a substrate structure that may be used in a display device. The substrate structure may include a base substrate, a transistor, and a first silicon oxynitride layer. The transistor may include a semiconductor member and a gate electrode and may overlap the base substrate. The first silicon oxynitride layer may directly contact at least one of the base substrate, the semiconductor member, and the gate electrode and may include (and/or contain) a first hydrogen atom set. A hydrogen concentration in the first silicon oxynitride layer may be greater than or equal to 1.52 atomic percent. Each of the first silicon oxynitride layer and the base substrate may be substantially transparent.

The hydrogen concentration in the first silicon oxynitride layer may be in a range of 9.34 atomic percent to 22.65 atomic percent.

The substrate structure may include a pixel electrode. The first silicon oxynitride layer may directly contact the gate electrode and may be positioned between the gate electrode and the pixel electrode.

The first silicon oxynitride layer may directly contact the base substrate.

The first silicon oxynitride layer may directly contact each of the semiconductor member and the gate electrode.

The substrate structure may include a second silicon oxynitride layer, which may include a second hydrogen atom set. A hydrogen concentration in the second silicon oxynitride layer may be in the range of 9.34 atomic percent to 22.65 atomic percent. At least one of the semiconductor member and the gate electrode may be positioned between the first silicon oxynitride layer and the second silicon oxynitride layer.

The substrate structure may include a third silicon oxynitride layer, which may include a third hydrogen atom set. A hydrogen concentration in the third silicon oxynitride layer may be in the range of 9.34 atomic percent to 22.65 atomic percent. The third silicon oxynitride layer may be positioned between the base substrate and the second silicon oxynitride layer.

The first hydrogen atom set may include a first hydrogen atom subset. The first hydrogen atom subset may form one-to-one silicon-hydrogen bonds with silicon atoms in the first silicon oxynitride layer. An atomic percentage of the first hydrogen atom subset in the first silicon oxynitride layer may be in a range of 1.52 percent to 5.04 percent.

The substrate structure may include a pixel electrode. The first silicon oxynitride layer may directly contact the gate electrode and may be positioned between the gate electrode and the pixel electrode.

The first silicon oxynitride layer may directly contact the base substrate.

The first silicon oxynitride layer may directly contact the semiconductor member.

The first silicon oxynitride layer may directly contact each of the semiconductor member and the gate electrode.

The substrate structure may include a second silicon oxynitride layer, which may include a second hydrogen atom set. The second hydrogen atom set may include a second hydrogen atom subset. The second hydrogen atom subset may form one-to-one silicon-hydrogen bonds with silicon atoms in the second silicon oxynitride layer. An atomic percentage of the second hydrogen atom subset in the second silicon oxynitride layer may be in the range of 1.52 percent to 5.04 percent. At least one of the semiconductor member and the gate electrode may be positioned between the first silicon oxynitride layer and the second silicon oxynitride layer.

The first silicon oxynitride layer may directly contact a first side of the semiconductor member. The second silicon oxynitride layer may directly contact a second side of the semiconductor member. The second side of the semiconductor member may be opposite the first side of the semiconductor member.

The first silicon oxynitride layer may directly contact the gate electrode. The second silicon oxynitride layer may directly contact the base substrate.

A hydrogen concentration in the second silicon oxynitride layer may be in a range of 9.34 atomic percent to 22.65 atomic percent.

A difference between a refractive index of the first silicon oxynitride layer and a refractive index of the base substrate may be less than or equal to 0.14.

Example embodiments may be related to a substrate structure that may be used in a display device. The substrate structure may include a base substrate, a transistor, and a first silicon oxynitride layer. The transistor may include a semiconductor member, a gate electrode, and source and drain electrodes and may overlap the base substrate. The first silicon oxynitride layer may be positioned between the gate electrode, and the source and drain electrodes and may include a first hydrogen atom set. A hydrogen concentration in the first silicon oxynitride layer may be greater than or equal to 1.52 atomic percent.

The substrate structure may include a first silicon oxide layer. The first silicon oxide layer may be positioned between the gate electrode and the first silicon oxynitride layer.

The substrate structure may include a second silicon oxynitride layer and a second silicon oxide layer. The second silicon oxynitride layer may be positioned between the semiconductor member and the gate electrode and may comprise a second hydrogen atom set. A hydrogen concentration in the second silicon oxynitride layer may be greater than or equal to 1.52 atomic percent. The silicon oxide layer may be positioned between the gate electrode and the first silicon oxynitride layer.

According to example embodiments, the insulation layer of the substrate structure may include and/or may be formed of silicon oxynitride and may contain hydrogen atoms. The insulation layer may have a predetermined hydrogen concentration for minimizing differences of refractive indices in the substrate structure. Therefore, satisfactory light transmittance of the substrate structure may be attained. Some of the hydrogen atoms may form one-to-one silicon-hydrogen bonds with some silicon atoms. The one-to-one silicon-hydrogen bonds may be relatively easily broken, such that hydrogen atoms may be released into the semiconductor member (i.e., active member) of the transistor for enhancing carrier mobility. Advantageously, the electron mobility of the transistor may be sufficiently high, so thus satisfactory performance of the transistor may be attained.

BRIEF DESCRIPTION OF THE DRAWINGS

FIG. 1 is a plan view illustrating a display substrate, e.g., a transparent display substrate, in accordance with example embodiments.

DETAILED DESCRIPTION OF THE EMBODIMENTS

Display devices, e.g., transparent display devices, and methods of manufacturing display devices in accordance with example embodiments are explained in detail with reference to the accompanying drawings.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The term "connect" may mean "mechanically connect", "electrically connect", "directly connect", or "indirectly connect". The term "insulate" may mean "electrically insulate". The term "conductive" may mean "electrically conductive". The term "electrically connected" may mean "electrically connected without any intervening transistors". If a component (e.g., a transistor) is described as (electrically) connected between a first element and a second element, then a source/drain/input/output terminal of the component may be electrically connected to the first element through no intervening transistors, and a drain/source/output/input terminal of the component may be electrically connected to the second element through no intervening transistors.

The term "conductor" may mean "electrically conductor". The term "insulator" may mean "electrically insulating member". The term "dielectric" may mean "dielectric member". The term "interconnect" may mean "interconnecting member". The term "prepare", the term "provide", or the term "form" may mean "prepare, provide, and/or form". The term "side" may mean "flat side", "planar side", or "straight side".

Figure 2A:
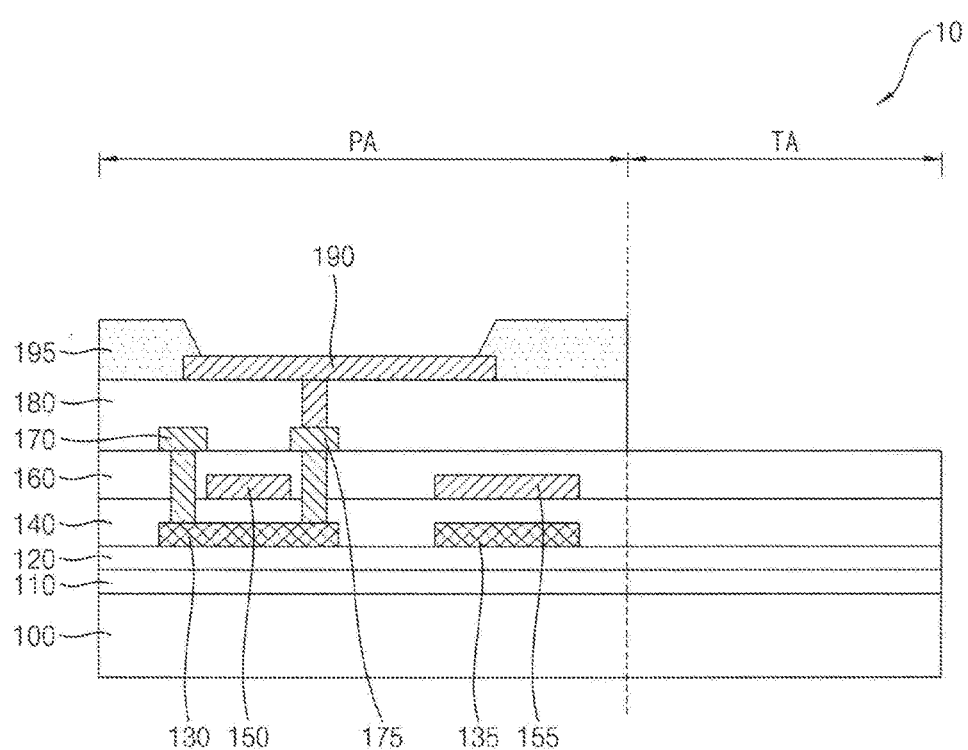
FIGS. 2A and 2B are cross-sectional views illustrating display substrates, e.g., transparent display substrates, in accordance with example embodiments.
Figure 2B:
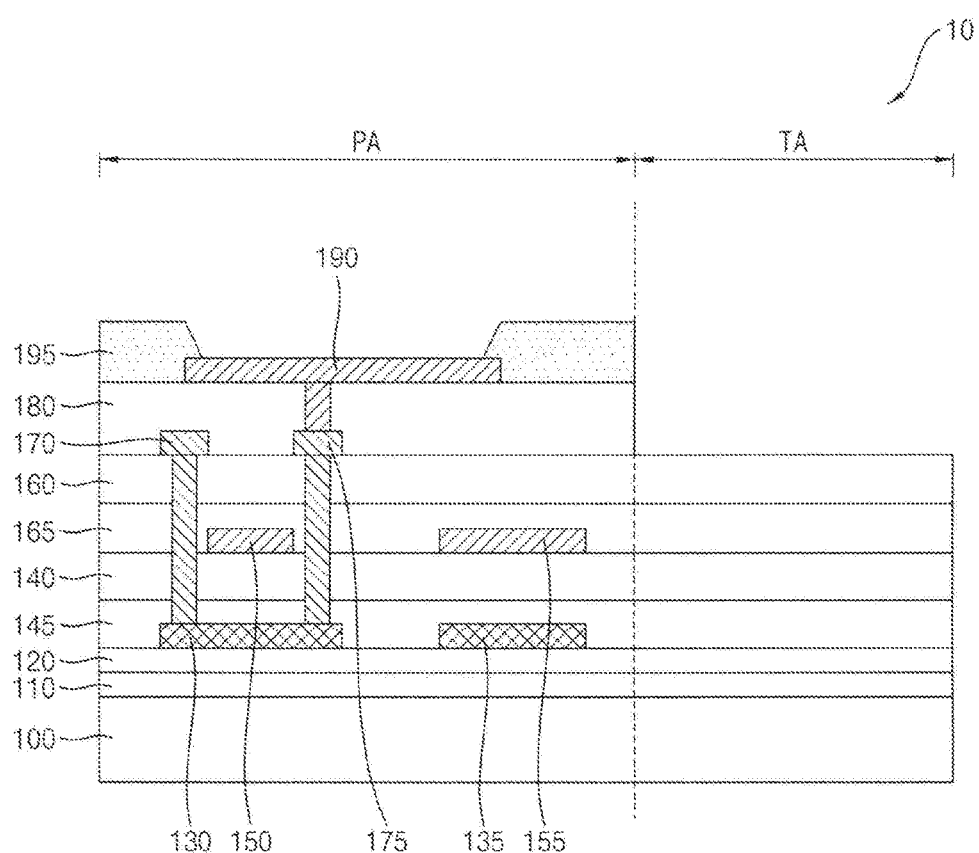

FIG. 1 is a plan view illustrating a display substrate, e.g., a transparent display substrate, in accordance with example embodiments. FIGS. 2A and 2B are cross-sectional views illustrating display substrates, e.g., transparent display substrates, in accordance with example embodiments. For example, FIGS. 2A and 2B are cross-sectional views taken along a line I-I' indicated in FIG. 1.

Referring to FIGS. 1, 2A and 2B, a transparent display substrate 10 may have a pixel area PA and a transmission area TA.

The pixel area PA may include a red pixel Pr, a green pixel Pg and a blue pixel Pb, which may be adjacent to one another. The transmission area TA may be adjacent to the pixel area PA. As illustrated in FIG. 1, the transmission area TA may extend near the red pixel Pr, the green pixel Pg and the blue pixel Pb. In some example embodiments, individually patterned transmission areas TA may be separately provided for each of the pixels such as the red pixel Pr, the green pixel Pg and the blue pixel Pb.

A transistor, e.g., thin film transistor (TFT) may be provided in each pixel, and the transistor may be electrically connected to a data line D and a scan line S. As illustrate in FIG. 1, the data line D and the scan line S may substantially cross each other, and the pixels may be defined in intersection regions defined by the data line D and the scan line S. A pixel circuit for each pixel may include the data line D, the scan line S and the transistor.

Although it is not illustrated in FIG. 1, the pixel circuit may additionally include a power line that may be substantially parallel to the date line D. Further, the pixel circuit may include a capacitor electrically connected to the power line and the transistor.

FIGS. 1, 2A and 2B illustrate one transistor provided in each of the red pixel Pr, the green pixel Pg and the blue pixel Pb, however, two or more transistors may be disposed in each of the red pixel Pr, the green pixel Pg and the blue pixel Pb. For example, a switching transistor and a driving transistor may be provided in each of the pixels Pr, Pg and Pb. Here, the capacitor may be electrically connected between the switching transistor and the driving transistor.

As illustrated in FIG. 2A, the transparent display substrate 10 may include a base substrate 100, the pixel circuit, a gate insulation layer 140, an insulation interlayer 160, and a pixel electrode 190. The pixel circuit may include an active member set (or semiconductor member set), a gate electrode set, a source electrode 170, and a drain electrode 175. In example embodiments, the transparent display substrate 10 may additionally include a barrier layer 110 and a buffer layer 120. A combination of the barrier layer 110 and the buffer layer 120 may be called a barrier-buffer layer. As illustrated in FIG. 2B, the transparent display substrate 10 may further include an additional gate insulation layer 145 and an additional insulation interlayer 165.

The transistor and the capacitor may be disposed on the buffer layer 120 located on the base substrate 100 in the pixel area PA. The transistor may include a first active member 130 (or semiconductor member 130), the gate insulation layer 140, a first gate electrode 150, the insulation interlayer 160, the source electrode 170, and the drain electrode 175. The capacitor may include a second active member 135 (or capacitor electrode 135), the gate insulation layer 140 and a second gate electrode 155 (or capacitor electrode 155). The barrier-buffer layer (110 and 120) may directly contact each of the semiconductor member 130 and the base substrate 100. In some example embodiments, the transistor may further include the additional gate insulation layer 145 and the additional insulation interlayer 165, and the capacitor may further include the additional gate insulation layer 145.

A via insulation layer 180 may be disposed on the insulation interlayer 160 to substantially cover the transistor. The pixel electrode 190 and a pixel defining layer 195 may be disposed on the via insulation layer 180.

A transparent insulation substrate may be used as the base substrate 100. For example, the base substrate 100 may include polymer having light-transmitting and flexible properties. In some example embodiments, the base substrate 100 may include (and/or may be made of) polyimide-based resin. The base substrate 100 may have the pixel area PA and the transmission area TA as described above.

The barrier layer 110 and the buffer layer 120 may be sequentially disposed on the base substrate 100. The barrier layer 110 and the buffer layer 120 may substantially cover an entire surface of the base substrate 100.

The barrier layer 110 may substantially block diffusion of moistures and/or impurities toward overlying structures through the base substrate 100. The diffusion of the moistures and/or impurities may be additionally prevented by the buffer layer 120, and stresses generated among the base substrate 100 and the overlying structures may be reduced or absorbed by the buffer layer 120. In example embodiments, each of the barrier layer 110 and the buffer layer 120 may be formed of and/or may include silicon oxynitride. In some example embodiments, each of the barrier layer 110 and the buffer layer 120 may be formed of and/or may include a composition substantially containing silicon oxynitride only.

Each of the barrier layer 110 and the buffer layer 120 may contain hydrogen atoms that form silicon-hydrogen bonds. In example embodiments, a total hydrogen concentration of each of the barrier layer 110 and the buffer layer 120 may be in a range of about 9.34 atomic percent to about 22.65 atomic percent. A total hydrogen concentration of the barrier-buffer layer (i.e., the combination of the layers 110 and 120) may be in the range of about 9.34 atomic percent to about 22.65 atomic percent. In some example embodiments, a concentration of hydrogen atoms that form one-to-one silicon-hydrogen bonds (Si—H) in each of the barrier layer 110 and the buffer layer 120 may be in a range of about 1.52 atomic percent to about 5.04 atomic percent. A concentration of hydrogen atoms that form one-to-one silicon-hydrogen (Si—H) bonds in the barrier-buffer layer (i.e., the combination of the layers 110 and 120) may be in the range of about 1.52 atomic percent to about 5.04 atomic percent. The total hydrogen concentration and the concentration of hydrogen atoms that form one-to-one silicon-hydrogen bonds will be described below.

The active member may be disposed on the buffer layer 120 in the pixel area PA. The active member may include the first active member 130 and the second active member 135. As illustrated in FIGS. 2A and 2B, the first and the second active members 130 and 135 may be located on the substantially same level or the substantially same plane over the base substrate 100.

The active member may include a silicon compound such as polysilicon. In example embodiments, a source region and a drain region, which may include p-type or n-type impurities, may be positioned at two end portions of the first active member 130. The second active member 135 may also include impurities where the impurities may be substantially distributed throughout the second active member 135. In some example embodiments, the active member may be formed of and/or may include oxide semiconductor such as at least one of indium gallium zinc oxide (IGZO), zinc tin oxide (ZTO), indium tin zinc oxide (ITZO), etc.

The gate insulation layer 140 may be disposed on the buffer layer 120 to substantially cover the first and the second active members 130 and 135. In example embodiments, the gate insulation layer 140 may include a silicon compound. In some example embodiments, the gate insulation layer 140 may have a single-layered structure substantially containing silicon oxynitride similar to the structure of the barrier layer 110 and/or the buffer layer 120.

The gate insulation layer 140 may contain hydrogen atoms that form silicon-hydrogen bonds. In example embodiments, a total hydrogen concentration in the gate insulation layer 140 may be in a range of about 9.34 atomic percent to about 22.65 atomic percent. In some example embodiments, a concentration of hydrogen atoms that form one-to-one silicon-hydrogen (Si—H) bonds in the gate insulation layer 140 may be in a range of about 1.52 atomic percent to about 5.04 atomic percent.

In some example embodiments, as illustrated in FIG. 2B, the additional gate insulation layer 145 may be disposed between the buffer layer 120 and the gate insulation layer 140 to substantially cover the first and the second active members 130 and 135. For example, the additional gate insulation layer 145 may include silicon oxide.

A gate electrode set may be disposed on the gate insulation layer 140. In example embodiments, the gate electrode set may include the first gate electrode 150 and the second gate electrode 155 (or capacitor electrode 155). The first gate electrode 150 and the second gate electrode 155 may be positioned on the gate insulation layer 140 and may be positioned over the first active member 130 and the second active member 135, respectively. As illustrate in FIGS. 2A and 2B, the first and the second gate electrodes 150 and 155 may be located on the substantially same level or the substantially same plane over the base substrate 100.

The first gate electrode 150 may be electrically connected to the scan line S. For example, the first gate electrode 150 may be branched from the scan line S.

The gate electrode set may be formed of and/or may include a metal, an alloy, a metal nitride, etc. For example, the gate electrode may include at least one of aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), alloys thereof, nitrides thereof, etc. These may be used alone or in a combination thereof. In some example embodiments, the gate electrode may have a double-layered structure such as an Al/Mo structure or a Ti/Cu structure so as to reduce a resistance of the gate electrode.

The insulation interlayer 160 may be disposed on the gate insulation layer 140 to substantially cover the first and the second gate electrodes 150 and 155. The insulation interlayer 160 may have a single-layered structure substantially containing silicon oxynitride similar to the structure of the barrier layer 110 and/or the buffer layer 120.

The insulation interlayer 160 may contain hydrogen atoms that form silicon-hydrogen bonds. In example embodiments, a total hydrogen concentration in the insulation interlayer 160 may be in a range of about 9.34 atomic percent to about 22.65 atomic percent. In some example embodiments, a concentration of hydrogen atoms that form one-to-one silicon-hydrogen (Si—H) bonds in the insulation interlayer 160 may be in a range of about 1.52 atomic percent to about 5.04 atomic percent.

In some example embodiments, as illustrated in FIG. 2B, the additional insulation interlayer 165 may be disposed between the gate insulation layer 140 and the insulation interlayer 160 to substantially cover the first and the second gate electrodes 150 and 155. For example, the additional insulation interlayer 165 may include silicon oxide.

The source electrode 170 and the drain electrode 175 may pass through the insulation interlayer 160 and the gate insulation layer 140 to thereby make contact with the first active member 130. Each of the source electrode 170 and the drain electrode 175 may be formed of and/or may include a metal, an alloy, a metal nitride, etc. For example, each of the source and the drain electrodes 170 and 175 may be formed or and/or may include at least one of Al, Ag, W, Cu, Ni, Cr, Mo, Ti, Pt, Ta, Nd, Sc, alloys thereof, nitrides thereof, etc. These may be used alone or in a combination thereof. In some example embodiments, each of the source electrode 170 and the drain electrode 175 may include at least two different metal layers, for example, an Al layer and a Mo layer.

The source electrode 170 and the drain electrode 175 may make contact with the source region and the drain region of the first active member 130, respectively. In this case, a portion of the first active member 130 between the source region and the drain region may be defined as a channel through which charges may move.

The source electrode 170 may be electrically connected to the data line D. For example, the source electrode 170 may be branched from the data line D.

As described above, the transistor may include the first active member 130, the gate insulation layer 140, the first gate electrode 150, the source electrode 170, and the drain electrode 175. The capacitor may include the second active member 135, the gate insulation layer 140, and the second gate electrode 155.

FIGS. 2A and 2B illustrate that the transistor has a top-gate structure in which the first gate electrode 150 is disposed over the first active member 130. In an embodiment, the transistor may have a bottom-gate structure in which the first gate electrode 150 is disposed under the first active member 130.

As illustrated in FIG. 2A, each of the barrier layer 110, the buffer layer 120, the gate insulation layer 140 and the insulation interlayer 160 may extend on the base substrate 100 from the pixel area PA to the transmission area TA. In some example embodiments, as illustrated in FIG. 2B each of the additional gate insulation layer 145 and the insulation interlayer 165 may extend on the base substrate 100 from the pixel area PA to the transmission area TA.

According to example embodiments, each of the barrier layer 110, the buffer layer 120, the gate insulation layer 140 and the insulation interlayer 160 may have a single-layered structure substantially containing silicon oxynitride as described above.

In a conventional display substrate, a transparent display substrate may include a barrier layer, a buffer layer, a gate insulation layer and an insulation interlayer that are stacked and are formed of silicon oxide and silicon nitride. For example, the barrier layer or the buffer layer may be formed of silicon nitride so as to block a diffusion of moisture. When silicon nitride layers are stacked, stresses may increase among the silicon nitride layers, so that a structure that includes the silicon nitride layers, e.g., a TFT of the transparent display device, may significantly deteriorate. Thus, a silicon oxide layer may be additionally included for absorbing or buffering the stresses generated among the silicon nitride layers.

When the silicon oxide layers and the silicon nitride layers are alternately and repeatedly stacked, interfaces may be formed among the silicon oxide and silicon nitride layers. When an external light is incident into a transmission area, a total reflection or an interference of the light may be caused by differences of refractive indices at the interfaces. Thus, light transmittance of the conventional display substrate may be unsatisfactory.

According to example embodiments, each of the barrier layer 110, the buffer layer 120, the gate insulation layer 140 and the insulation interlayer 160 may be formed of silicon oxynitride. Therefore, potential differences in refractive indices caused by different compositions or materials may be substantially prevented. As a result, satisfactory light transmittance in the transmission area TA may be attained.

Each of the barrier layer 110, the buffer layer 120, the gate insulation layer 140 and the insulation interlayer 160 may include silicon oxynitride, which may have advantages of silicon oxide and silicon nitride. For example, each of the barrier layer 110, the buffer layer 120, the gate insulation layer 140, and the insulation interlayer 160 may sufficiently prevent a diffusion of moistures and/or impurities from an outside while preventing excessive stresses from being generated therebetween.

Generally, silicon oxynitride may contain less hydrogen than silicon nitride. If insulation layers, such as a barrier layer, a buffer layer, a gate insulation layer, and an insulation interlayer, contain insufficient hydrogen, the amounts of hydrogen supplied from the insulation layers to an active member of a thin film transistor (TFT) may be insufficient, and electron mobility of the TFT may be insufficient. Moreover, the amounts of hydrogen contained in the insulation layers may influence refractive indices of the insulation layers, so that light transmittance of the transparent display substrate may be influenced.

Figure 3:
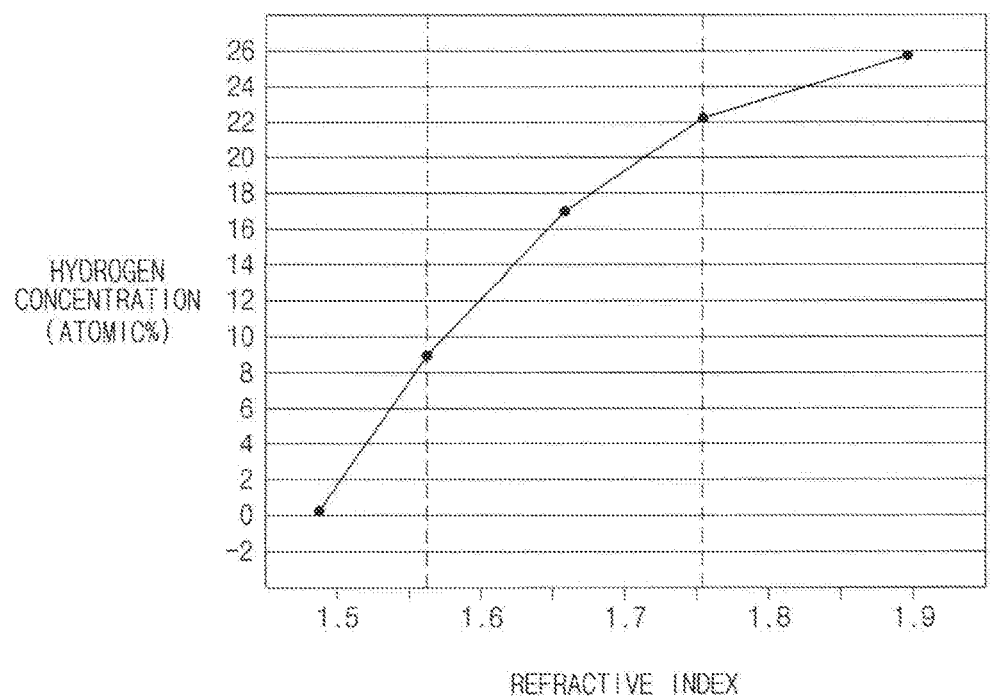
FIG. 3 is a graph illustrating relation between possible values of the hydrogen concentration in an insulation layer containing (and/or formed of) silicon oxynitride and possible values of the refractive index of the insulation layer in accordance with example embodiments.

FIG. 3 is a graph illustrating relation between possible values of the hydrogen concentration in an insulation layer containing (and/or formed of) silicon oxynitride and possible values of the refractive index of the insulation layer in accordance with example embodiments.

Referring to FIG. 3, the refractive index of the insulation layer including silicon oxynitride may vary according to the amount of hydrogen in the insulation layer. Approximately, as the amount of hydrogen in the insulation layer increase, the refractive index of the insulation layer may also increase. If a difference between a refractive index of the base substrate 100 and the refractive index of the insulation layer is greater than a certain value, total reflection of incident light may occur, and light transmittance of the transparent display substrate may be unsatisfactory.

According to some example embodiments, each of the barrier layer 110, the buffer layer 120, the gate insulation layer 140, and the insulation interlayer 160 may contain hydrogen atoms, and a total hydrogen concentration of each of the barrier layer 110, the buffer layer 120, the gate insulation layer 140, and the insulation interlayer 160 may be in a range of about 9.34 atomic percent to about 22.65 atomic percent. In embodiments, the base substrate 100 includes polyimide-based resin, and a refractive index of the base substrate 100 may be in a range of 1.65 to 1.75, e.g., about 1.7. As illustrated in FIG. 3, when each of the barrier layer 110, the buffer layer 120, the gate insulation layer 140, and the insulation interlayer 160 has the hydrogen concentration of the above mentioned range, each of the barrier layer 110, the buffer layer 120, the gate insulation layer 140, and the insulation interlayer 160 may have a refractive index in a range of about 1.564 to about 1.752. The difference between the refractive index of the base substrate 100 and each of the refractive indices of the layers 100, 120, 140, and 160 may be less than or equal to 0.14. Therefore, potential total reflection of light due to a significant difference of refractive indices may be avoided, and light transmittance of the transparent display substrate 10 may be greater than 90% and/or may be satisfactory.

According to some example embodiments, each of the barrier layer 110, the buffer layer 120, the gate insulation layer 140, and the insulation interlayer 160 may contain hydrogen atoms that form one-to-one silicon-hydrogen (Si—H) bonds with silicon atoms, and a concentration of hydrogen atoms that form the one-to-one silicon-hydrogen bonds in each of the barrier layer 110, the buffer layer 120, the gate insulation layer 140, and the insulation interlayer 160 may be in a range of about 1.52 atomic percent to about 5.04 atomic percent. Hydrogen atoms may form silicon-hydrogen bonds such as Si—H bonds, Si—H$_2$ bonds, etc. with silicon atoms. Among the silicon-hydrogen bonds, the Si—H bond has relatively low binding energy between silicon and hydrogen, so that hydrogen may be relatively easily detached from silicon, and the hydrogen may be supplied to the first active member 130 of the TFT. Therefore, electron mobility of the TFT may be increased, possibly because the hydrogen fills defects of the first active member 130.

Moreover, when each of the barrier layer 110, the buffer layer 120, the gate insulation layer 140, and the insulation interlayer 160 has the hydrogen concentration of the above mentioned range, each of the barrier layer 110, the buffer layer 120, the gate insulation layer 140, and the insulation interlayer 160 may have a refractive index in a range of about 1.564 to about 1.752. Here, the transparent display substrate 10 may have a satisfactory light transmittance, which may be greater than about 90%.

The via insulation layer 180 may be disposed on the insulation interlayer 160 to substantially cover the source electrode 170 and the drain electrode 175. A via structure for electrically connecting the pixel electrode 190 to the drain electrode 175 may be provided in the via insulation layer 180. Further, the via insulation layer 180 may substantially serve as a planarization layer. For example, the via insulation layer 180 may include an organic material such as polyimide, epoxy-based resin, acryl-based resin, polyester, or the like.

In example embodiments, the via insulation layer 180 may be selectively disposed in the pixel area PA and may not extend to the transmission area TA. Thus, a reduction of the transmittance caused by the organic material in the transmission area TA may be prevented.

The pixel electrode 190 may locate on the via insulation layer 180, and may include the via structure electrically connected to the drain electrode 175 through the via insulation layer 180. In example embodiments, individual pixel electrodes 190 may be provided in the pixels, respectively.

In example embodiments, the pixel electrode 190 may function as a reflective electrode. For example, the pixel electrode 190 may include a metal such as Al, Ag, W, Cu, Ni, Cr, Mo, Ti, Pt, Ta, Nd or Sc, or alloys thereof.

In some example embodiments, the pixel electrode 190 may include a transparent conductive material having a relatively high work function. For example, the pixel electrode 190 may be formed of and/or may include at least one of indium tin oxide (ITO), indium zinc oxide (IZO), zinc oxide, indium oxide, etc. Additionally, the pixel electrode 190 may have a multi-layered structure including the above transparent conductive material and the above metal.

The pixel defining layer (PDL) 195 may be positioned on the via insulation layer 180. The PDL 195 may substantially cover a peripheral portion of the pixel electrode 190. The PDL 195 may include, e.g., a transparent organic material such as polyimide-based resin or acryl-based resin.

In example embodiments, the PDL 195 may be selectively disposed on a portion of the via insulation layer 180 in the pixel area PA, and may at least partially expose the pixel electrode 190. Thus, the PDL 195 may not extend to the transmission area TA. In some example embodiments, sidewalls of the PDL 195 and the via insulation layer 180 may be located on substantially the same plane.

Figure 4:
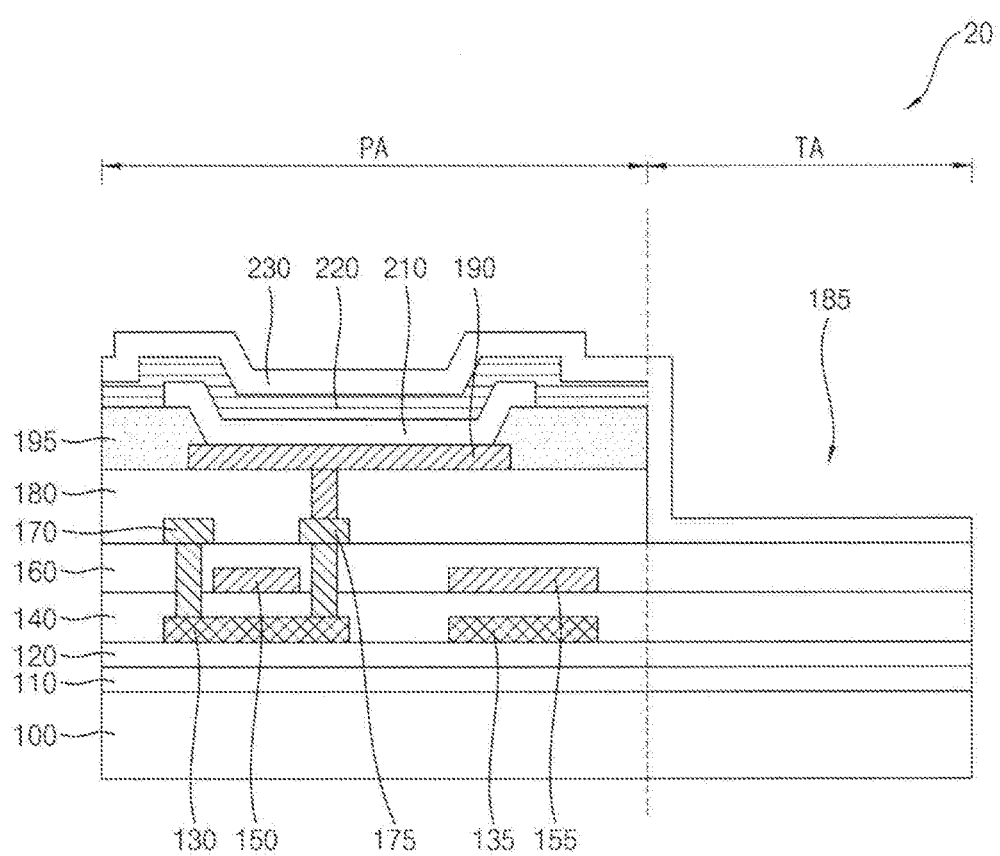
FIG. 4 is a cross-sectional view illustrating a display device, e.g., a transparent display device, in accordance with example embodiments.

FIG. 4 is a cross-sectional view illustrating a transparent display device in accordance with example embodiments. For example, FIG. 4 may illustrate an organic light-emitting display (OLED) device including the transparent display substrate illustrated with reference to FIGS. 1 and 2A.

Detailed descriptions on elements and/or structures substantially the same as or similar to those illustrated with reference to FIGS. 1 and 2A will be omitted.

Referring to FIG. 4, a transparent display device 20 may include a display layer 210, an opposing electrode 220 and an encapsulation layer 230 sequentially stacked on the transparent display substrate.

The display layer 210 may be disposed on the PDL 195 and the pixel electrode 190. The display layer 210 may be individually provided in the pixels Pr, Pg and Pb. For example, the display layer 210 may include organic light emitting layers individually located in the red pixel Pr, the green pixel Pg, and the blue pixel Pb so as to generate different colors of light, e.g., a red color of light, a green color of light, or a blue color of light. Each of the organic light-emitting layers may include a host material excited by holes and electrons, and a dopant material for facilitating an absorbance and a release of energy and improving a light-emitting efficiency.

In some example embodiments, the display layer 210 may further include a hole transport layer (HTL) interposed between the pixel electrode 190 and the organic light-emitting layer. The display layer 210 may further include an electron transport layer (ETL) interposed between the opposing electrode 220 and the organic light-emitting layer.

The HTL may include a hole transport material, e.g., 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The ETL may include an electron transport material, e.g., tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinozaline, or a combination thereof.

In some example embodiments, the display layer 210 may include a liquid crystal layer instead of the organic light-emitting layer. In this case, the transparent display device 10 may correspond to a liquid crystal display (LCD) device.

As illustrated in FIG. 4, the display layer 210 may be located on a sidewall of the PDL 195 and on a surface of the pixel electrode 190 exposed by the PDL 195. The display layer 210 may extend partially onto a surface of the PDL 195. In example embodiments, the display layer 210 may be confined by the sidewall of the PDL 195, so that the display layer 210 may be individually disposed in each of the pixels.

In some example embodiments, the HTL and/or the ETL included in the display layer 210 may extend to a plurality of pixels, such that the plurality of the pixels may share the HTL and/or the ETL.

The opposing electrode 220 may be disposed on the PDL 195 and the display layer 210. The opposing electrode 220 may substantially face the pixel electrode 190 by interposing the display layer 210 therebetween.

In example embodiments, the opposing electrode 220 may serve as a common electrode provided for the plurality of the pixels. The pixel electrode 190 and the opposing electrode 220 may function as an anode and a cathode of the transparent display device 20, respectively. For example, the opposing electrode 220 may include a metal having a relatively low work function such as Al, Ag, W, Cu, Ni, Cr, Mo, Ti, Pt, Ta, Nd, or Sc, or alloys thereof.

As illustrated in FIG. 4, the display layer 210 and the opposing electrode 220 may be selectively positioned in the pixel area PA, and may not extend to the transmission area TA. Hence, a reduction of a transmittance in the transmission area TA may be minimized.

The encapsulation layer 230 may extend from the pixel area PA to the transmission area TA so as to substantially cover the opposing electrode 220 and the insulation interlayer 160. The encapsulation layer 230 may include an inorganic material, e.g., silicon nitride and/or metal oxide.

In some example embodiments, a capping layer (not illustrated) may be interposed between the opposing electrode 220 and the encapsulation layer 230. Here, the capping layer may include an organic material such as polyimide resin, epoxy resin or acryl resin, or inorganic material such as silicon oxide, silicon nitride or silicon oxynitride.

A transmitting window 185 may be defined in the transmission area TA. In some example embodiments, portions of the via insulation layer 180 in the transmission area TA may be removed to form the transmitting window 185. A surface of the insulation interlayer 160 may be exposed by the transmitting window 185. In this case, the transmitting window 185 may be defined by sidewalls of the PDL 195 and the via insulation layer 180, and the surface of the insulation interlayer 160.

FIGS. 5 to 10 are cross-sectional views illustrating a method of manufacturing a transparent display device in accordance with example embodiments.

Figure 5:
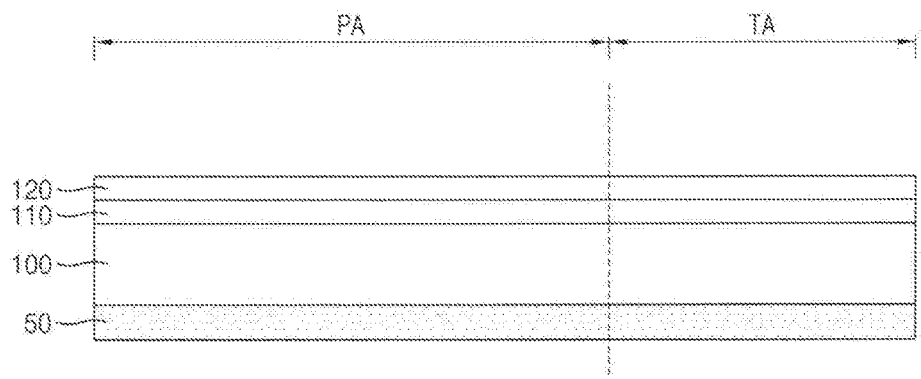
FIG. 5, FIG. 6, FIG. 7, FIG. 8, FIG. 9, and FIG. 10 are cross-sectional views illustrating structures formed in a method of manufacturing a display device, e.g., a transparent display device, in accordance with example embodiments.

Referring to FIG. 5, a base substrate 100 may be formed on a carrier substrate 50, and then a barrier layer 110 and a buffer layer 120 may be sequentially formed on the base substrate 100. The base substrate 100 may have a pixel area PA and a transmission area TA. The barrier layer 110 and the buffer layer 120 may be formed in the pixel area PA and the transmission area TA.

The carrier substrate 50 may support the base substrate 100 while performing manufacturing processes for the transparent display device 20. For example, a glass substrate or a metal substrate may be used as the carrier substrate 50.

The base substrate 100 may be formed using transparent polymer resin, e.g., polyimide-based resin. For example, a precursor composition containing a polyimide precursor may be coated on the carrier substrate 50 by a spin coating process so as to form a coating layer on the carrier substrate 50. This coating layer may be thermally treated to provide the base substrate 100 on the carrier substrate 50.

The polyimide precursor may include diamine and dianhydride. The precursor composition may be prepared by dissolving the polyimide precursor in an organic solvent. The organic solvent may include, e.g., N-methyl-2-pyrrolidone (NMP), dimethylformamide (DMF), tetrahydrofuran (THF), triethylamine (TEA), ethylacetate (ethylacetate), dimethylsulfoxide (DMSO), an ethylene glycol-based ether solvent, etc. These may be used alone or in a combination thereof.

A polymerization reaction of diamine and dianhydride may be initiated by the thermal treatment process to form a polyamic acid structure, and then the polyamic acid structure may be further thermally treated such that a condensation reaction may occur to form the polyimide-based resin.

In example embodiments, each of the barrier layer 110 and the buffer layer 120 may be formed using silicon oxynitride. In some example embodiments, each of the barrier layer 110 and the buffer layer 120 may substantially contain silicon oxynitride only. For example, each of the barrier layer 110 and the buffer layer 120 may be formed by a chemical vapor deposition (CVD) process, a plasma enhanced chemical vapor deposition (PECVD) process, a high density plasma-chemical vapor deposition (HDP-CVD) process, etc.

In some example embodiments, the carrier substrate 50 having the base substrate 100 thereon may be loaded in a process chamber, and then a silicon oxide precursor and a nitrogen source may be introduced onto the base substrate 100 to form the barrier layer 110 and the buffer layer 120 on the base substrate 100. The silicon oxide precursor may include, e.g., tetraethyl orthosilicate (TEOS) or plasma enhanced oxide (PEOX). The nitrogen source may include ammonia ($NH_3$), nitrous oxide ($N_2O$), or the like.

In some example embodiments, a silicon source and an oxygen source may be separately introduced in the process chamber instead of the silicon oxide precursor. For example, the silicon source may include silane ($SiH_4$), disilane ($Si_2H_6$), dichlorosilane ($SiH_2Cl_2$), or the like. Further, the oxygen source may include, e.g., oxygen ($O_2$) or ozone ($O_3$).

In example embodiments, each of the barrier layer 110 and the buffer layer 120 may be formed using hydrogen atoms that form silicon-hydrogen bonds. In some example embodiments, a total hydrogen concentration in each of the barrier layer 110 and the buffer layer 120 may be in a range of about 9.34 atomic percent to about 22.65 atomic percent. In some example embodiments, a concentration of hydrogen atoms that form one-to-one silicon-hydrogen (Si—H) bonds in each of the barrier layer 110 and the buffer layer 120 may be in a range of about 1.52 atomic percent to about 5.04 atomic percent. A flow rate of silane and/or disilane introduced in the process chamber may be controlled to control the total hydrogen concentration or the hydrogen concentration for forming the silicon-hydrogen bonds.

Figure 6:
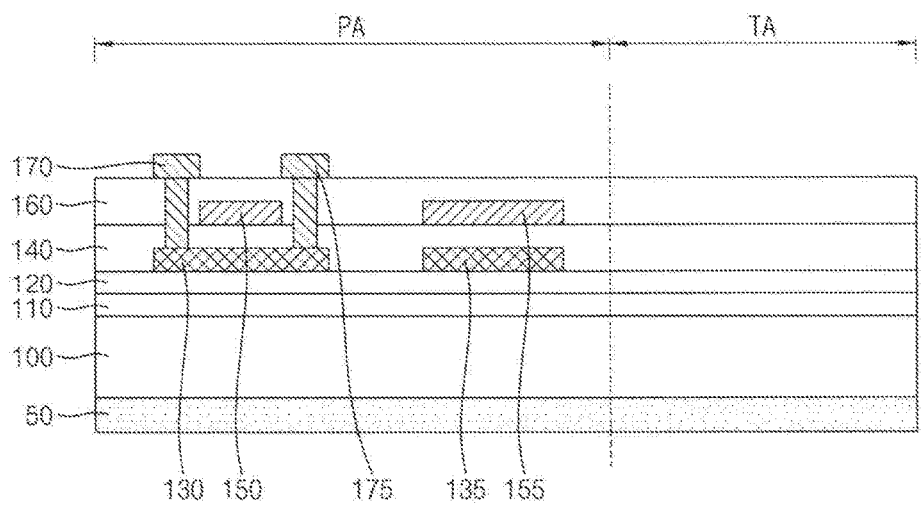

Referring to FIG. 6, additional insulation layers and a pixel circuit may be formed on the buffer layer 120.

A first active member 130 and a second active member 135 may be formed on the buffer layer 120. In this case, a semiconductor layer may be formed on the buffer layer 120 using amorphous silicon or polysilicon, and then the semiconductor layer may be patterned to form the first and the second active members 130 and 135 on the buffer layer 120. In example embodiments, a crystallization process such as a low temperature polycrystalline silicon (LTPS) process or a laser crystallization process may be performed about the semiconductor layer after the formation of the semiconductor layer. In some example embodiments, the semiconductor layer may be formed using oxide semiconductor such as at least one of IGZO, ZTO, ITZO, etc.

After a gate insulation layer 140 covering the first and the second active members 130 and 135 may be formed on the buffer layer 120, and a first gate electrode 150 and a second gate electrode 155 may be formed on the gate insulation layer 140. Here, after a first conductive layer may be formed on the gate insulation layer 140, the first conductive layer may be etched by, e.g., a photolithography process to form a first gate electrode 150 and a second gate electrode 155 on the gate insulation layer 140. The first gate electrode 150 and the second gate electrode 155 may substantially located on portions of the gate insulation layer 140 where the first active member 130 and the second active member 135 are positioned, respectively.

The first conductive layer may be formed using metal, alloy or metal nitride. The first conductive layer may be formed by depositing a plurality of metal layers on the gate insulation layer 140.

The first and the second gate electrodes 150 and 155 may be formed simultaneously with a scan line S (see FIG. 1). For example, the first and the second gate electrodes 150 and 155, and the scan line S may be formed by patterning the first conductive layer. Here, the scan line S may be connected to the first gate electrode 150.

In some example embodiments, impurities may be implanted into the first active member 130 using the first gate electrode 150 as an implantation mask, such that a source region and a drain region may be formed at both end portions of the first active member 130.

An insulation interlayer 160 may be formed on the gate insulation layer 140 to substantially cover the first and the second gate electrodes 150 and 155. A source electrode 170 and a drain electrode 175 may be formed through the insulation interlayer 160 and the gate insulation layer 140 to make contact with the first active member 130. For example, the insulation interlayer 160 and the gate insulation layer 140 may be partially etched to form contact holes through which the first active member 130 may be partially exposed. After a second conductive layer filling the contact holes may be formed on the insulation interlayer 160, and the second conductive layer may be patterned by a photolithography process to form the source electrode 170 and the drain electrode 175.

The source electrode 170 and the drain electrode 175 may contact the source region and the drain region, respectively. Further, the source electrode 170 may be connected to a data line D (see FIG. 1). In this case, the source electrode 170, the drain electrode 175 and the data line D may be formed by simultaneously patterning the second conductive layer in one etching process.

The second conductive layer may be formed using a metal, an alloy or a metal nitride. The second conductive layer may be formed by depositing a plurality of metal layers on the insulation interlayer 160.

In example embodiments, each of the gate insulation layer 140 and the insulation interlayer 160 may be formed using silicon oxynitride. In some example embodiments, each of the gate insulation layer 140 and the insulation interlayer 160 may contain silicon oxynitride only. The gate insulation layer 140 and the insulation interlayer 160 may be formed using a material by a process substantially the same as or similar to those for the barrier layer 110 and the buffer layer 120. The gate insulation layer 140 and the insulation interlayer 160 may be formed in the pixel area PA and the transmission area TA. The gate insulation layer 140 and the insulation interlayer 160 may be sequentially formed on the buffer layer 120.

In example embodiments, each of the gate insulation layer 140 and the insulation interlayer 160 may be formed using hydrogen atoms that form silicon-hydrogen bonds. In some example embodiments, a total hydrogen concentration in each of the gate insulation layer 140 and the insulation interlayer 160 may be in a range of about 9.34 atomic percent to about 22.65 atomic percent. In some example embodiments, a concentration of hydrogen atoms that form one-to-one silicon-hydrogen (Si—H) bonds in each of the gate insulation layer 140 and the insulation interlayer 160 may be in a range of about 1.52 atomic percent to about 5.04 atomic percent. As described above, a flow rate of silane and/or disilane. introduced in the process chamber may be controlled to control the total hydrogen concentration or the concentration of hydrogen atoms that form the one-to-one silicon-hydrogen bonds.

Additionally, the first and the second conductive layers may be formed by a CVD process, a PECVD process, an HDP-CVD process, a thermal evaporation process, a sputtering process, an atomic layer deposition (ALD) process and a printing process.

A TFT including the source electrode 170, the drain electrode 175, the first gate electrode 150, the gate insulation layer 140 and the first active member 130 may be provided in the pixel area PA. A capacitor including the second active member 135, the gate insulation layer 140 and the second gate electrode 155 may be also provided in the pixel area PA. Accordingly, the pixel circuit including the data line D, the scan line S, the TFT and the capacitor may be formed in the pixel area PA.

Figure 7:
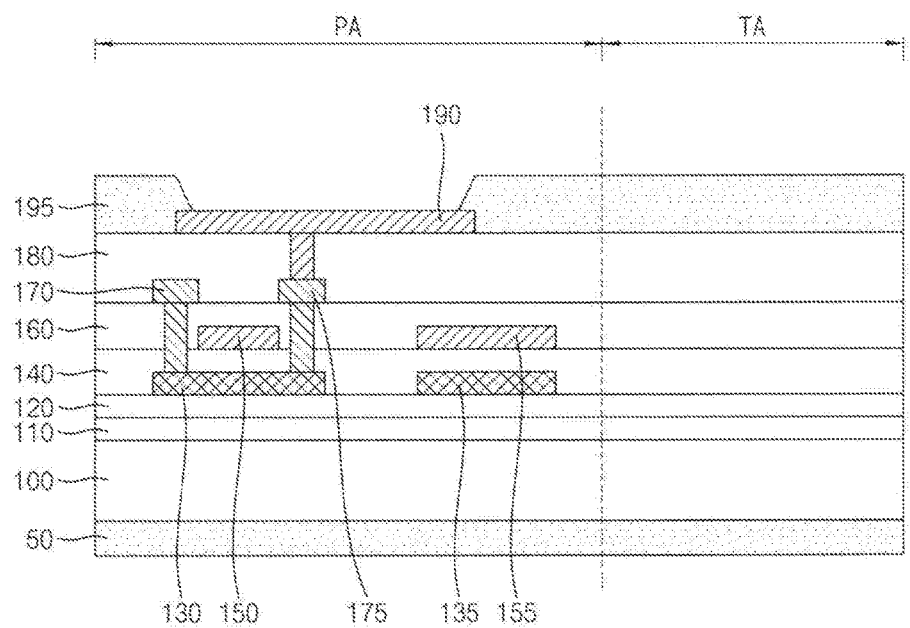

Referring to FIG. 7, a via insulation layer 180 may be formed on the insulation interlayer 160 to substantially cover the source electrode 170 and the drain electrode 175. For example, the via insulation layer 180 may be formed using a transparent organic material such as polyimide, epoxy-based resin, acryl-based resin or polyester. The via insulation layer 180 may have a sufficient thickness and also may have a substantially flat or planar surface. The via insulation layer 180 may be formed by a spin coating process or a printing process.

A pixel electrode 190 may be formed on the via insulation layer 180 to be electrically connected to the TFT. For example, the via insulation layer 180 may be partially etched to form a via hole through which the drain electrode 175 may be partially exposed. After a third conductive layer sufficiently filling the via hole may be formed on the via insulation layer 180 and the exposed drain electrode 175, the third conductive layer may be patterned to form the pixel electrode 190 on the via insulation layer 180.

The third conductive layer may be formed using a metal such as Al, Ag, W, Cu, Ni, Cr, Mo, Ti, Pt, Ta, Nd or Sc, or alloys of those metals by a thermal evaporation process, a vacuum deposition process, a sputtering process, an ALD process, a CVD process, a printing process, etc. In some example embodiments, the third conductive layer may be formed using a transparent conductive material such as ITO, IZO, zinc oxide, indium oxide, etc.

A PDL 195 may be formed on the via insulation layer 180. The PDL 195 may substantially cover a peripheral portion of the pixel electrode 190 and the transmission area TA. A surface of the pixel electrode 190 may be partially exposed through the PDL 195. Here, a plurality of openings exposing portions of the pixel electrode 190 may be formed through the PDL 195. For example, a photosensitive organic material such as polyimide resin or acryl resin may be coated on the via insulation layer 180, and then the PDL 195 may be obtained exposure and developing processes.

Figure 8:
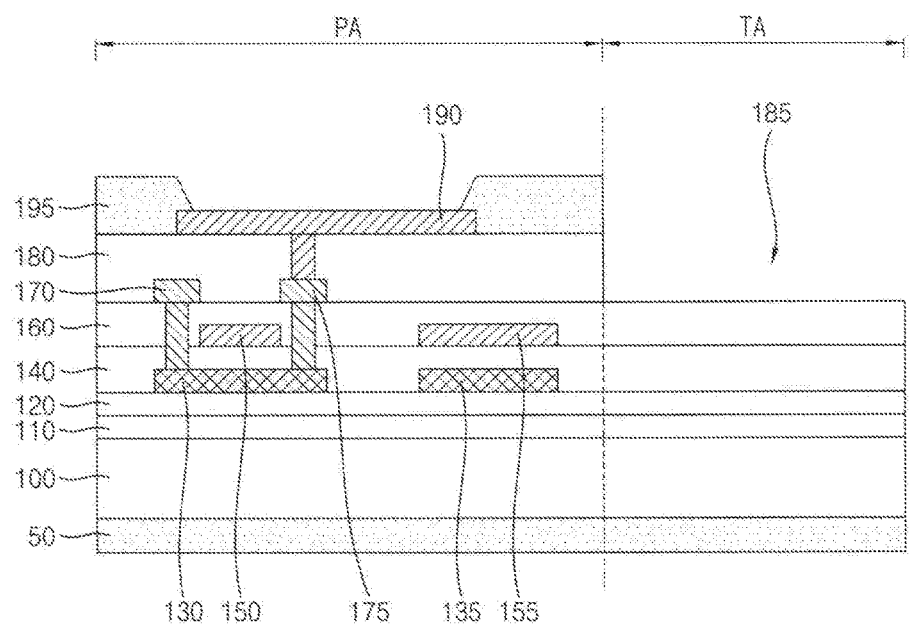

Referring to FIG. 8, portions of the PDL 195 and the insulation layers positioned in the transmission area TA may be partially removed to form an transmitting window 185 in the transmission area TA.

In example embodiments, as illustrated in FIG. 8, portions of the PDL 195 and the via insulation layer 180 in the transmission area TA may be removed to form the transmitting window 185. A surface of the insulation interlayer 160 may be exposed by the transmitting window 185. In this case, the transmitting window 185 may be defined by sidewalls of the PDL 195 and the via insulation layer 180, and the surface of the insulation interlayer 160.

The PDL 195 and the via insulation layer 180 may include substantially the same organic material. Thus, the PDL 195 and the via insulation layer 180 may be removed together by one etching process to relatively easily form the transmitting window 185 in the transmission area TA.

Figure 9:
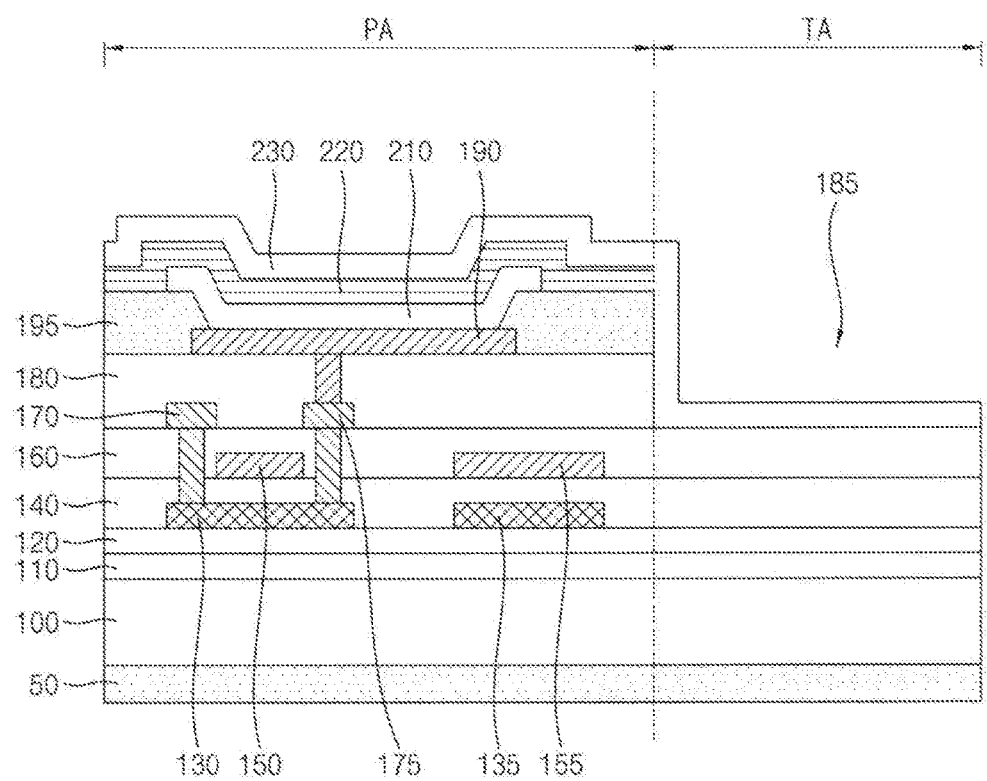

Referring to FIG. 9, a display layer 210 and an opposing electrode 220 may be selectively formed in the pixel area PA, and an encapsulation layer 230 may be formed to substantially cover the pixel area PA and the transmission area TA.

The display layer 210 may be formed using an organic light-emitting material for generating a red color of light, a green color of light or a blue color of light. For example, the display layer 210 may be formed by a spin coating process, a roll printing process, a nozzle printing process or an inkjet process using a fine metal mask (FMM) that may include an opening through which a region corresponding to a red pixel, a green pixel, or a blue pixel is exposed. Therefore, a plurality of organic light-emitting layers for generating colors of light may be formed in a plurality of pixels, respectively.

In some example embodiments, an HTL may be formed before the formation of the organic light-emitting layer using the above-mentioned hole transport material. An ETL may be also formed on the organic light-emitting layer using the above-mentioned electron transport material. The HTL and the ETL may be formed on surfaces of the PDL 195 and the pixel electrode 190, such that the HTL and the ETL may be shared by the plurality of pixels. Alternatively, the HTL or the ETL may be patterned for each of the pixels.

A metal having a relatively low work function such as Al, Ag, W, Cu, Ni, Cr, Mo, Ti, Pt, Ta, Nd or Sc, or alloys of these metals may be deposited on the display layer 210 to form the opposing electrode 220. For example, a mask having openings exposing the plurality of the pixels may be used to deposit the metal by, e.g., a sputtering process for the formation of the opposing electrode 220.

The encapsulation layer 230 may be formed on the opposing electrode 220. The encapsulation layer 230 may cover the opposing electrode 220 and may extend to the transmission area TA along a sidewall and a bottom of the transmitting window 185.

The encapsulation layer 230 may be formed using an inorganic material such as silicon nitride, metal oxide, etc.

In some example embodiments, a capping layer (not illustrated) may be formed on the opposing electrode 220 before the formation of the encapsulation layer 230 using an organic material such as polyimide resin, epoxy resin or acryl resin, or an inorganic material such as silicon oxide, silicon nitride or silicon oxynitride.

Figure 10:
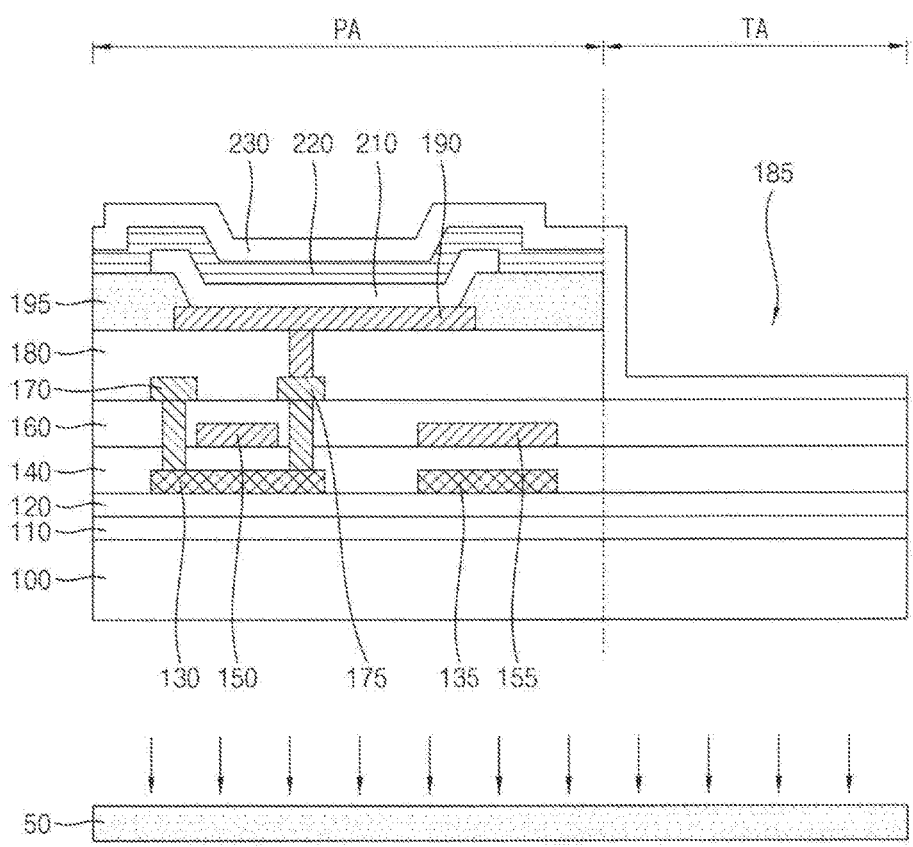

Referring to FIG. 10, the carrier substrate 50 may be separated from the base substrate 100. For example, a laser-lift process may be performed to separate the carrier substrate 50 from the base substrate 100. Alternatively, a mechanical tension may be applied to detach the carrier substrate 50 without the laser-lift process.

The transparent display substrates and the transparent display devices with satisfactory light transmittance according to example embodiments may be applied to various electronic devices. For example, the transparent display substrates and the transparent display devices may be applied to computers, cellular phones, smart phones, smart pads, MP3 players, and navigators for automobiles.

Although a few example embodiments have been described, those skilled in the art will readily appreciate that many modifications are possible in the example embodiments without materially departing from the novel teachings and advantages of the embodiments.

What is claimed is:

1. A substrate structure for use in a display device, the substrate structure comprising:
   a base substrate;
   a transistor, which comprises a semiconductor member and a gate electrode and overlaps the base substrate; and
   a first silicon oxynitride layer, which directly contacts at least one of the base substrate, the semiconductor member, and the gate electrode and comprises a first hydrogen atom set, wherein a difference between a refractive index of the first silicon oxynitride layer and a refractive index of the base substrate is less than or equal to 0.14.

2. The substrate structure of claim 1, wherein the hydrogen concentration in the first silicon oxynitride layer is in a range of 9.34 atomic percent to 22.65 atomic percent.

3. The substrate structure of claim 2, wherein the first silicon oxynitride layer directly contacts the base substrate.

4. The substrate structure of claim 2, wherein the first silicon oxynitride layer directly contacts each of the semiconductor member and the gate electrode.

5. The substrate structure of claim 2 comprising: a second silicon oxynitride layer, which comprises a second hydrogen atom set, wherein a hydrogen concentration in the second silicon oxynitride layer is in the range of 9.34 atomic percent to 22.65 atomic percent, wherein at least one of the semiconductor member and the gate electrode is positioned between the first silicon oxynitride layer and the second silicon oxynitride layer.

6. The substrate structure of claim 5 comprising: a third silicon oxynitride layer, which comprises a third hydrogen atom set, wherein a hydrogen concentration in the third silicon oxynitride layer is in the range of 9.34 atomic percent to 22.65 atomic percent, wherein the third silicon oxynitride layer is positioned between the base substrate and the second silicon oxynitride layer.

7. The substrate structure of claim 1, wherein the first hydrogen atom set comprises a first hydrogen atom subset, wherein the first hydrogen atom subset forms one-to-one silicon-hydrogen bonds with silicon atoms in the first silicon oxynitride layer, and wherein an atomic percentage of the first hydrogen atom subset in the first silicon oxynitride layer is in a range of 1.52 percent to 5.04 percent.

8. The substrate structure of claim 7 comprising: a pixel electrode, wherein the first silicon oxynitride layer directly contacts the gate electrode and is positioned between the gate electrode and the pixel electrode.

9. The substrate structure of claim 7, wherein the first silicon oxynitride layer directly contacts the base substrate.

10. The substrate structure of claim 7, wherein the first silicon oxynitride layer directly contacts the semiconductor member.

11. The substrate structure of claim 7, wherein the first silicon oxynitride layer directly contacts each of the semiconductor member and the gate electrode.

12. The substrate structure of claim 7 comprising: a second silicon oxynitride layer, which comprises a second hydrogen atom set, wherein the second hydrogen atom set comprises a second hydrogen atom subset, wherein the second hydrogen atom subset forms one-to-one silicon-hydrogen bonds with silicon atoms in the second silicon oxynitride layer, wherein an atomic percentage of the second hydrogen atom subset in the second silicon oxynitride layer is in the range of 1.52 percent to 5.04 percent, and wherein at least one of the semiconductor member and the gate electrode is positioned between the first silicon oxynitride layer and the second silicon oxynitride layer.

13. The substrate structure of claim 12, wherein the first silicon oxynitride layer directly contacts a first side of the semiconductor member, wherein the second silicon oxynitride layer directly contacts a second side of the semiconductor member, and wherein the second side of the semiconductor member is opposite the first side of the semiconductor member.

14. The substrate structure of claim 13, wherein the first silicon oxynitride layer directly contacts the gate electrode, and wherein the second silicon oxynitride layer directly contacts the base substrate.

15. The substrate structure of claim 12, wherein a hydrogen concentration in the second silicon oxynitride layer is in a range of 9.34 atomic percent to 22.65 atomic percent.

16. The substrate structure of claim 1, wherein a hydrogen concentration in the first silicon oxynitride layer is greater than or equal to 1.52 atomic percent.

17. A substrate structure for use in a display device, the substrate structure comprising:
- a base substrate;
- a transistor, which comprises a semiconductor member, a gate electrode, and source and drain electrodes and overlaps the base substrate;
- a first silicon oxynitride layer, which is positioned between the gate electrode and the source and drain electrodes and comprises a first hydrogen atom set;
- a first silicon oxide layer, which is positioned between the gate electrode and the first silicon oxynitride layer; and
- a second silicon oxynitride layer, which is positioned between the semiconductor member and the gate electrode; and
- a second silicon oxide layer, which is positioned between the semiconductor member and the second silicon oxynitride layer.

18. The substrate structure of claim 17, wherein a hydrogen concentration in the first silicon oxynitride layer is greater than or equal to 1.52 atomic percent.

19. The substrate structure of claim 18, wherein a second silicon oxynitride layer comprises a second hydrogen atom set, and wherein a hydrogen concentration in the second silicon oxynitride layer is greater than or equal to 1.52 atomic percent.

20. A substrate structure for use in a display device, the substrate structure comprising:
- a base substrate;
- a transistor, which comprises a semiconductor member and a gate electrode and overlaps the base substrate;
- a first silicon oxynitride layer; and
- a pixel electrode, wherein two opposite faces of the first silicon oxynitride layer respectively directly contact two opposite faces of the gate electrode, and wherein the first silicon oxynitride layer is positioned between the gate electrode and the pixel electrode.

* * * * *